(12) United States Patent
Park

(10) Patent No.: US 7,622,319 B2
(45) Date of Patent: Nov. 24, 2009

(54) CMOS IMAGE SENSOR AND MANUFACTURING METHOD THEREOF

(75) Inventor: Byung-jun Park, Suwon-si (KR)

(73) Assignee: Samsung Electronics Co. Ltd., Suwon-si, Gyeonggi-do (KR)

( * ) Notice: Subject to any disclaimer, the term of this patent is extended or adjusted under 35 U.S.C. 154(b) by 349 days.

(21) Appl. No.: 11/734,687

(22) Filed: Apr. 12, 2007

(65) Prior Publication Data
US 2008/0035967 A1 Feb. 14, 2008

(30) Foreign Application Priority Data
Jun. 30, 2006 (KR) .................. 10-2006-0060950

(51) Int. Cl.
*H01L 21/00* (2006.01)
(52) U.S. Cl. .............. 438/48; 438/57; 438/59; 257/E27.133
(58) Field of Classification Search .......... 438/48, 438/57, 59, 60
See application file for complete search history.

(56) References Cited

U.S. PATENT DOCUMENTS 6,908,839 B2   6/2005   Rhodes

FOREIGN PATENT DOCUMENTS

| KR | 1020050117036 | 12/2005 |
|---|---|---|
| KR | 1020060000105 | 1/2006 |
| KR | 1020060002260 | 1/2006 |
| KR | 1020060063381 | 6/2006 |

OTHER PUBLICATIONS

English Abstract for Publication No. 1020060000105.
English Abstract for Publication No. 1020060063381.
English Abstract for Publication No. 1020050117036.
English Abstract for Publication No. 1020060002260.

*Primary Examiner*—Zandra Smith
*Assistant Examiner*—Paul E Patton
(74) *Attorney, Agent, or Firm*—F. Chau & Associates, LLC

(57) ABSTRACT

A CMOS image sensor includes isolation regions and a photo diode region formed in a substrate, gate electrodes formed on the substrate, impurity injection regions formed in the substrate respectively positioned between the gate electrodes and the isolation regions, silicide regions formed on upper surfaces of the gate electrodes and the impurity injection regions, a first insulating layer formed on a surface of the photodiode region and sides of the gate electrodes, a second insulating layer formed on the first insulating layer, a third insulating layer formed on the second insulating layer, an interlayer insulating layer formed to cover the third insulating layer, and via plugs vertically passing through the interlayer insulating layer and connected to the silicide regions.

12 Claims, 7 Drawing Sheets

CMOS IMAGE SENSOR AND MANUFACTURING METHOD THEREOF

CROSS REFERENCE TO RELATED APPLICATION

This application claims priority from Korean Patent Application No, 10-2006-0060950 filed on Jun. 30, 2006 in the Korean Intellectual Property Office, the disclosure of which is incorporated herein by reference in its entirety.

BACKGROUND OF THE INVENTION

1. Field of the Invention

The present invention relates to a CMOS (complementary metal-oxide-semiconductor) image sensor and a manufacturing method thereof, and more particularly, to a CMOS image sensor substantially un-damaged by etching of a photodiode region, and to a manufacturing method thereof.

2. Description of Related Art

A CMOS image sensor is an image capturing device having low power consumption and small size. The CMOS image sensor is widely used in digital cameras and mobile phones. It is technologically important to reduce a dark current in the CMOS image sensor. The dark current can result in deteriorating image quality and the occurrence of white points when charges caused by the dark current are greater than charges corresponding to light received by a photodiode of the CMOS.

The dark current may be caused by many factors. Specifically, dangling bonds exiting on a photodiode surface of a silicon substrate contribute to the generation of the dark current. The dangling bonds on the surface of the silicon substrate are generated by unstable polymerization and are affected by surface damage from dry etching during the process of manufacturing the CMOS image sensor. For example, when an upper surface of the photodiode is damaged by plasma dry etching during the manufacturing process, the polymerization on the surface becomes unstable and the dark current results during operation of the CMOS.

SUMMARY OF THE INVENTION

According to an exemplary embodiment of the present invention, a CMOS image sensor includes isolation regions and a photo diode region formed in a substrate, gate electrodes formed on the substrate, impurity injection regions formed in the substrate respectively positioned between the gate electrodes and the isolation regions, silicide regions formed on upper surfaces of the gate electrodes and the impurity injection regions, a first insulating layer formed on a surface of the photodiode region and sides of the gate electrodes, a second insulating layer formed on the first insulating layer, a third insulating layer formed on the second insulating layer, an interlayer insulating layer formed to cover the third insulating layer, and via plugs vertically passing through the interlayer insulating layer to he connected to the silicide regions.

The first insulating layer may be a silicon oxide layer, the second insulating layer may be a silicon nitride layer, and the third insulating layer may be a silicon oxynitride layer.

An intermediate insulating layer as a silicon oxide layer may he formed between the first insulating layer and the surface of the substrate.

A width ratio of upper and lower portions of the second and third insulating layers formed on the sides of the gate electrodes may be about 0.8 to 1.0.

The width of the third insulating layer formed on the photodiode region may be greater than the width of the third insulating layer formed on the sides of the gate electrodes.

The impurity injection regions may include first impurity injection regions aligned to the sides of the gate electrodes and adjacent to one side of the isolation regions, and second impurity injection regions not aligned to the sides of the gate electrodes and adjacent to one side of the isolation regions, the second impurity injection regions being formed to he deeper than the first impurity injection regions.

The third insulating layer formed on the sides of the gate electrodes may be formed so as not to overlap the second impurity injection regions.

According to another exemplary embodiment of the present invention, a method of manufacturing a CMOS image sensor includes forming isolation regions in a substrate, forming a first insulating layer on an entire surface of the substrate, forming gate electrodes on the first insulating layer, forming a photodiode region in the substrate, forming first impurity (N−) injection regions, each serving as one of a source and a drain of the gate electrodes, forming a second insulating layer (SiN) covering the first insulating layer (Gox) and the gate electrodes, forming patterns of the second insulating layer (SiN) exposing the first insulating layer (Gox) formed on the first impurity (N−) injection regions and forming first spacers on sides of the gate electrodes, forming second impurity (N+) injection regions, each serving as one of a source and a drain of the gate electrodes, removing the patterns of the second insulating layer (SiN), forming a third insulating layer (MTO) covering a result of removing the patterns of the second insulating layer, forming a fourth insulating layer (SiN) to cover the third insulating layer (MTO), forming a fifth insulating layer (SiON) to cover the fourth insulating layer (SiN), etching surfaces of the fourth and fifth insulating layers (SiN and SiON) exposing the third insulating layer (MTO) formed on upper portions of the gate electrodes and on surfaces of the second impurity injection regions, and forming patterns of the fourth and fifth insulating layer (SiN and SiON) forming second spacers on the sides of the gate electrodes, removing the patterns of the fifth insulating layer (SiON), removing an exposed third insulating layer (MTO) exposing the first insulating layer (Gox) formed on the upper portions of the gate electrodes and the surfaces of the second impurity injection regions, removing an exposed first insulating layer (Gox) exposing the upper surfaces of the gate electrodes and the surfaces of the second impurity injection regions, forming metal layers on the upper surfaces of the gate electrodes and the surfaces of the second impurity injection regions, forming silicide layers by heating the metal layers, forming a sixth insulating layer (SiON) covering a result of forming silicide layers, forming an interlayer insulating layer covering the sixth insulating layer, and forming via plugs vertically passing through the interlayer insulating layer and connected to the silicide layers.

A intermediate insulating layer may he formed between the first insulating layer and the gate electrodes. The intermediate insulating layer may be formed of silicon oxide.

The first and third insulating layers may be silicon oxide films, and the first insulating layer may be a gate insulating film insulating the substrate from the gate electrodes.

The gate electrodes may be formed of polycrystalline silicon.

The photodiode region may include N type impurity injection regions and P type impurity injection regions formed in the substrate, the N type impurity injection regions formed deeper in the substrate than the P type impurity injection regions.

The second and fourth insulating layers may be silicon nitride films. The forming of the first impurity injection regions includes forming first N type impurity injection regions, and forming first P type impurity injection regions.

The forming of the second impurity injection regions includes forming second N type impurity injection regions and second P type impurity injection regions. Further, the second impurity injection regions may he more heavily doped than the first impurity injection regions.

The fifth and sixth insulating layers may he silicon oxy nitride films and silicide may be one of WSi, CoSi, TiSi, and NiSi.

BRIEF DESCRIPTION OF THE DRAWINGS

The present invention will become more apparent by describing in detail preferred embodiments thereof with reference to the attached drawings, in which.

DETAILED DESCRIPTION OF PREFERRED EMBODIMENTS

Figure 1:
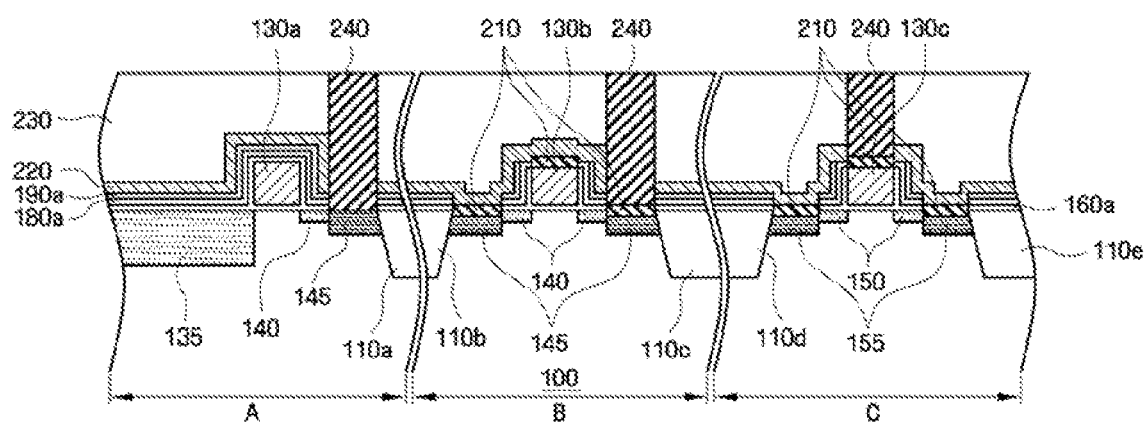
FIG. 1 is a schematic cross-sectional view showing a CMOS image sensor according to an embodiment of the present invention.

The present invention and methods of accomplishing the same may be understood more readily by reference to the following detailed description of preferred embodiments and the accompanying drawings. The present invention may, however, be embodied in many different forms and should not be construed as being limited to embodiments set forth herein. Rather, embodiments are provided so that this disclosure will be thorough and complete and will fully convey the concept of the present invention to those skilled in the art. In the drawings, the size and relative size of layers and regions are exaggerated for clarity. Like reference numerals refer to like elements throughout the specification.

Embodiments in this specification will be described with reference to plan views and cross-sectional views, which are ideal schematic views. Accordingly, the forms of exemplary views may be changed according to manufacturing technology and/or allowable margin of error. Thus, embodiments of the present invention are not limited to the specific forms that are shown but include the change of the forms generated according to manufacturing processes. Accordingly, regions exemplified in the drawings are schematically shown, and the shapes of the regions exemplified in the drawings are shown to exemplify the specific shapes of regions in a device and are not limiting.

Hereinafter, a CMOS image sensor and a manufacturing method thereof according to an embodiment of the present invention will be described in detail with reference to the accompanying drawings.

FIG. 1 is a schematic cross-sectional view showing a CMOS image sensor according an embodiment of the present invention. A region A may be a cell region including a photodiode 135, a region B may he an NMOS region, and a region C may be a PMOS region.

Referring to FIG. 1, the CMOS image sensor includes isolation regions 110a, 110b, 110c, 110d, and 110e and a photo diode region 135 formed in a substrate 100. The CMOS image sensor includes gate electrodes 130a, 130b, and 130c formed on the substrate 100, and impurity injection regions 140, 145, 150, and 155 formed in the substrate 100 and positioned between the gate electrodes 130a, 130b, and 130c and the isolation regions 110a, 110b, 110c, 110d, and 110e. The CMOS image sensor also includes silicide regions 210 formed on upper surfaces of the gate electrodes 130a, 130b, and 130c and surfaces of the impurity injection regions 140, 145, 150, and 155. The CMOS image sensor further includes a first insulating layer 180a formed on a surface of the photodiode region 135 and sides of the gate electrodes 130a, 130b, and 130c, a second insulating layer 190a formed on the first insulating layer 180a, a third insulating layer 220 formed on the second insulating layer 190a, an interlayer insulating layer 230 formed to cover the third insulating layer 220. Via plugs 240 penetrate the interlayer insulating layer 230 and are connected to the silicide region 210.

The first insulating layer 180a may be formed of, for example, silicon oxide and the second insulating layer 190a may be formed of, for example, silicon nitride.

An intermediate insulating layer 160a may be formed between the first insulating layer 180a and the surface of the substrate 100. The intermediate insulating layer 160a may be formed by silicon oxide. When a silicon oxide film (refer to reference number 120 shown in FIGS. 2 and 4) is formed on the surface of the substrate 100 in order to form a gate insulating film, the intermediate insulating layer 160a may be formed between the first insulating layer 180a and the silicon oxide film 120. Further, the intermediate insulating layer 160a may be formed between the first insulating layer 180a and the surfaces of the gate electrodes 130a, 130b, and 130c.

The third insulating layer 220 may be formed of silicon nitride. Further, the third insulating layer 220 may serve as a reflection preventing film on a surface of the photodiode region 135.

A width ratio of the second insulating layer 190a and the third insulating layer 220 formed on the sides of the gate electrodes 130a, 130b, and 130c is about 0.8 to 1.0. The second insulating layer 190a and the third insulating layer 220 do not have the form of spacers and keep an initial shape. Therefore, the second insulating layer 190a and the third insulating layer 220 may be formed on the sides of the gate electrodes 130a, 130b, and 130c and the widths between the upper portions and the lower portions of the second insulating layer 190a and the third insulating layer 220 may be substantially the same. Differences in the widths between the upper portions and the lower portions of the second insulating layer 190a and the third insulating layer 220 may be due to various variables of the process. When the second insulating layer 190a and the third insulating layer 220 are formed by a well-known method, such as CVD (chemical vapor deposition), the width ratio of the upper and lower portions of the second insulating layer 190a and the third insulating layer 220 is about 0.8 to 1.0. When the second insulating layer 190a and the third insulating layer 220 are formed to have spacer shapes by an etching process, a width ratio between the upper portion and the lower portion is about 0 and the width ratio does not generally reach about 0.5.

In the photodiode region 135, N type or P type impurities may be injected. Even though it is not shown in FIG. 1, the p type impurities may he shallowly injected to be close to the surface the substrate 100 and the N type impurities may be deeply injected to be separated from the surface of the substrate 100 such that the photodiode region 135 can be formed. That is, regions where the N type impurities are injected are formed under regions where the P type impurities are injected.

Further, the thickness of the third insulating layer 220 formed on the photodiode region 135 may be larger than the width of the third insulating layer 220 formed on the side of the gate electrodes 130a, 130b, and 130c. When the third insulating layer 220 is formed, the etching process of forming a spacer is not performed. Therefore, the thickness/width of the third insulating layer 220 may be maintained as it was initially formed, and the thickness of the third insulating layer 220 formed on the photodiode region 135 may be larger than the width of the third insulating layer 220 formed on the side of the gate electrodes 130a, 130b, and 130c. When etching the third insulating layer 220 in order to form a spacer, the thickness of the third insulating layer 220 formed on the photodiode region 135 becomes smaller than the width of the third insulating layer 220 formed on the side of the gate electrodes 130a, 130b, and 130c. Because of the thinning of the third insulating layer 220 formed on the photodiode region 135, the photodiode region 135 is more prone to be attacked by plasma than the side of the gate electrodes 130a, 130b, and 130c.

The third insulating layer 220 may not form spacers on the NMOS region B and the PMOS region C as well as the cell region A. Therefore, the via plugs 240 connected to the silicide regions 210 have good alignment. More particularly, when a spacer is formed in the third insulating layer 220, the width of a bottom of the side of the gate electrodes 130a, 130b, and 130c, that is, width of portions close to the surface of the substrate 100 becomes large, and the bottom of the spacer may overlap a part of the silicide region 210. When forming the via plug 240, the width of the third insulating layer 220 or the spacer may block the silicide region 210. Since the CMOS image sensor has no spacer, the third insulating layer 220 does not block the silicide region 210 when forming the via plug 240. Therefore, the CMOS image sensor has good alignment. Further, since an area for forming the via plug 240 can be sufficiently secured, the CMOS image sensor has low resistance.

In FIG. 1, the third insulating layer 220 is adjacent to the via plugs 240. However, the third insulating layer 220 may be formed to be separated from the via plugs 240.

The impurity injection regions 140, 145, 150, and 155 may be formed in the substrate 100. The impurity injection regions 140, 145, 150, and 155 may include lightly-doped impurity injection regions 140 and 150 formed from the surface of the substrate shallower than heavily-doped impurity injection regions 145 and 155, which overlap the lightly-doped impurity injection regions 140 and 150. In FIG. 1, the lightly-doped impurity injection regions 140 and 150 are separated from the heavily-doped impurity injection regions 145 and 155. However, the heavily-doped impurity injection regions 145 and 155 may overlap the lightly-doped impurity injection regions 140 and 150.

The lightly-doped impurity injection regions 140 and 150 may be aligned to the sides of the gate electrodes 130a, 130b, and 130c and be adjacent to one side of the isolation regions 110a, 110b, 110c, 110d, and 110e. The heavily-doped impurity injection regions 145 and 155 may not be aligned to the sides of the gate electrodes 130a, 130b, and 130c. The heavily-doped impurity injection regions 145 and 155 are disposed adjacent to the isolation regions 110a, 110b, 110c, 110d, and 110e.

On the sides of the gate electrodes 130a, 130b, and 130c, the first insulating layer 180a, the second insulating layer 190a, and the third insulating layer 220 may be formed. On upper portions of the gate electrode 130a where the silicide regions 210 are not formed, the first insulating layer 180a, the second insulating layer 190a, and the third insulating layer 220 may be formed.

When the intermediate insulating layer 160a is further formed, the intermediate insulating layer 160a may be formed to surround the gate electrodes 130a, 130b, and 130c.

in FIG. 1, the silicide regions 210 are aligned on the surfaces of the heavily-doped impurity injection regions 145 and 155. The silicide regions 210 need not be aligned on the surfaces of the heavily-doped impurity injection regions 145 and 155. The silicide regions 210 are formed by diffusion of atoms of silicon or metal. The silicide regions 210 may be formed on the surface of the lightly-doped impurity injection regions 140 and 150, where the lightly-doped impurity injection regions 140 and 150 and the heavily-doped impurity injection regions 145 and 155 overlap.

One of ordinary skill in the art would appreciate that the relative size of each part and a forming method thereof may vary according to the characteristics or the degree of integration. A method of manufacturing a CMOS image sensor according to an embodiment of the present invention will be described with reference to the accompanying drawings.

FIGS. 2 to 14 are schematic cross-sectional views illustrating a method of manufacturing a CMOS image sensor according to an embodiment of the present invention.

Figure 2:
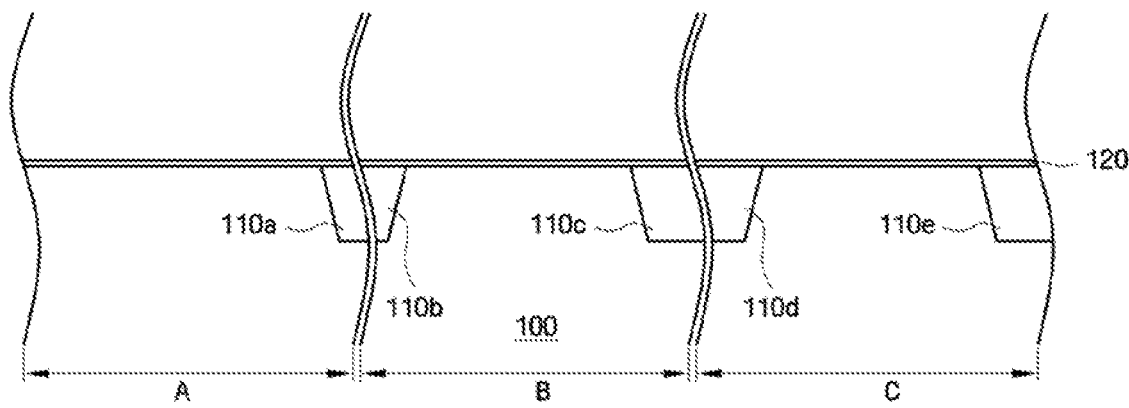
FIGS. 2 to 14 are schematic cross-sectional views showing a method of manufacturing a CMOS image sensor according to an embodiment of the present invention.

Referring to FIG. 2, the isolation regions 110a, 110b, 110c, 110d, and 110e are formed in the substrate 100 and a first silicon oxide film 120 is formed on the substrate 100.

The region A may be a cell region, the region B may be an NMOS region, and the region C may be a PMOS region. For example, the isolation regions 110a, 110b, 110c, 110d, and 110e may be formed using a well-known STI (Shallow Trench Isolation) method. The first silicon oxide film 120 may be formed by any of a number of methods. For example, the first silicon oxide film 120 may he formed by a deposition method, a dispensing method, or a silicon oxidation method. The first silicon oxide film 120 having a thickness of about 60 Å may be formed by the deposition method. Further, the first silicon oxide film 120 may be used as the gate oxide film or a buffer layer for protecting the surface of the substrate 100 when injecting impurities.

Figure 3:
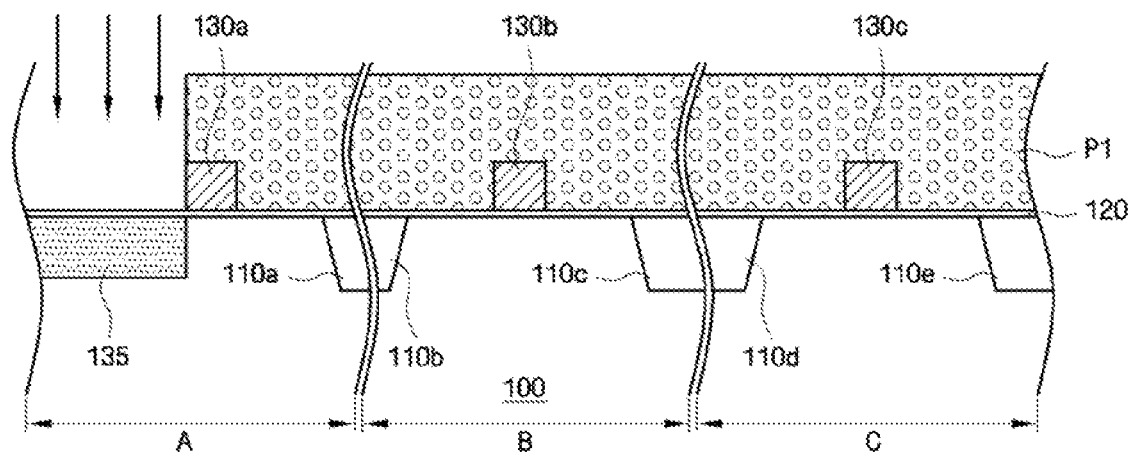

Referring to FIG. 3, the gate electrodes 130a, 130b, and 130c are formed, a first photoresist pattern P1 is formed, and the photodiode region 135 is formed by injecting the impurities in the substrate 100.

The gate electrodes 130a, 130b, and 130c may be formed of, for example, polycrystalline silicon. The gate electrodes 130a, 130b, and 130c may be formed by forming the polycrystalline silicon layer on the first silicon oxide film 120 and performing a photolithography process and an etching process. The widths and heights of the gate electrodes 130a, 130b, and 130c may be different.

A first photoresist pattern P1 for opening the photodiode region 135 is formed by applying the photoresist to cover the first silicon oxide film 120 and the gate electrodes 130a, 130b, and 130c, and performing the photolithography process.

The photodiode region 135 is formed by injecting impurities into a portion of the substrate 100 exposed by the photolithography process. The impurities injected into the photodiode region 135 are N type and P type impurities. The photodiode region 135 is formed by injecting both N type and P type impurities. For example, the P type impurities may be shallowly injected to be close to the surface of the substrate 100 relative to the N type impurities and the N type impurities may be deeply injected to be far from the surface of the substrate 100 relative to the P type impurities. The method of forming the photodiode region 135 is well known.

The first photoresist pattern P1 is removed.

Figure 4:
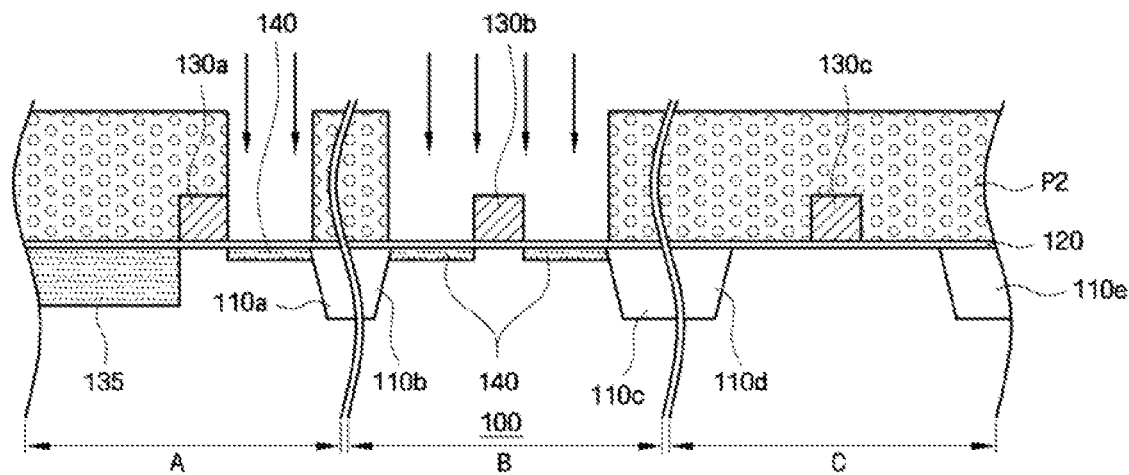

Referring to FIG. 4, a second photoresist pattern P2 for selectively opening a region where the N type impurities are injected is formed and the N type impurities are injected so as to form an N type impurity injection region 140. The N type impurities may be P (phosphorous) ion or As (arsenic) ion.

The P and As ions may be injected. The N type impurity injection region 140 may be formed by injecting, for example, the As ions to achieve a 2.5 E15/cm$^2$ dose.

The second photoresist pattern P2 is removed.

Figure 5:
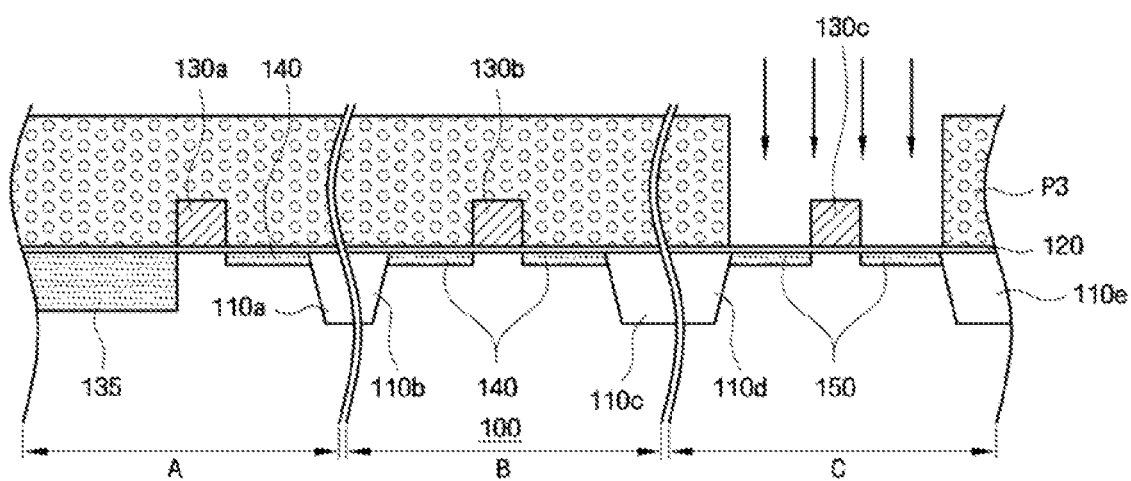

Referring to FIG. 5, a third photoresist pattern P3 for selectively opening a region where the P type impurities are injected is formed and the P type impurities are injected so as to form a P type impurity injection region 150. The P type impurities may be B (boron) ion. The P type impurity injection region 150 may be formed by injecting, for example, the B ions to achieve a 5.0 E12/cm$^2$ dose The second photoresist pattern P2 is removed.

Figure 6:
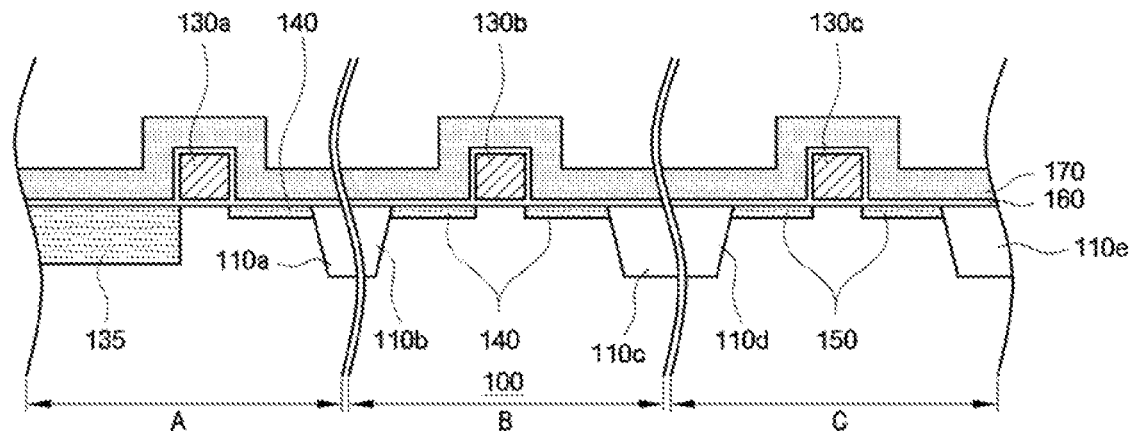

Referring to FIG. 6, the second silicon oxide film 160 and the first silicon nitride film 170 are formed. The second silicon oxide film 160 may be formed on the surface of the substrate 100, the surface of the first silicon oxide film 120, and the surfaces of the gate electrodes 130a, 130b, and 130c. The second silicon oxide film 160 is used to improve the interface adhesion with the first silicon nitride film 170 to be formed. The second silicon oxide film 160 is also used to relieve or protect the first silicon oxide film 120 and the gate electrodes 130a, 130b, and 130c from the surface stress or damage during later processes. The second silicon oxide film 160 and first silicon nitride film 170 may be formed by a deposition method, specifically, a CVD (chemical vapor deposition) method. The second silicon oxide film 160 may be formed to have a thickness, for example, about 150 Å or less, and the silicon nitride film 170 may be formed to have a thickness, for example, about 300 Å or less. Further, the second silicon oxide film 160 may not be formed. That is, the second silicon oxide film 160 may be omitted.

Figure 7:
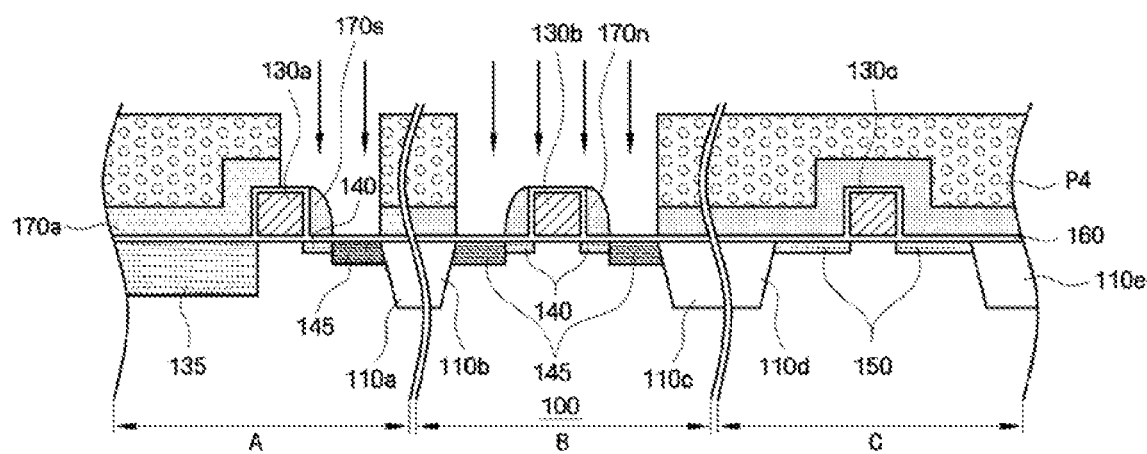

Referring to FIG. 7, a fourth photoresist pattern P4 is formed to form a N+ impurity injection region 145, silicon nitride film spacers 170s and 170n are formed on the cell region A and the sides of the gate electrodes 130a and 130b formed on the NMOS region B by etching the first silicon nitride film 170, and the N+ impurity injection region 145 is formed by injecting the N type impurities. The first silicon nitride film 170 transforms to a first silicon nitride film pattern 170a on which the silicon nitride film spacers 170s and 170n are formed in the cell region A and the NMOS region B. A method of forming the first silicon nitride film pattern 170a by etching the first silicon nitride film 170 may be performed by, for example, making a halogen element gas, such as CHF$_3$ (trifluoromethane), CF$_4$ (tetrafluoromethane), C$_2$F$_4$ (tertafluoroethene), C$_2$F$_6$ (hexafluoroethane), C$_4$F$_8$ (octafluorocyclobutane), including F (flourine), Cl (chlorine), or Br (bromine) to be excited to plasma state. Since methods of forming the spacers 170s and 170n by etching the first silicon nitride film 170 are well known, the detailed explanation will be omitted. When the N type impurities are injected, the fourth photoresist pattern P4 and the silicon nitride film spacers 170s and 170n may be served as an ion injection mask. The N+ type impurity injection region 145 may be formed by, for example, injecting the P type ions by 2.0 E15/cm$^2$ dose or injecting the As ions to achieve a 5.0 E15/cm$^2$ dose. Further, the N+ type impurity injection region 145 may be formed by injecting both ions. The fourth photoresist pattern P4 is removed.

Figure 8:
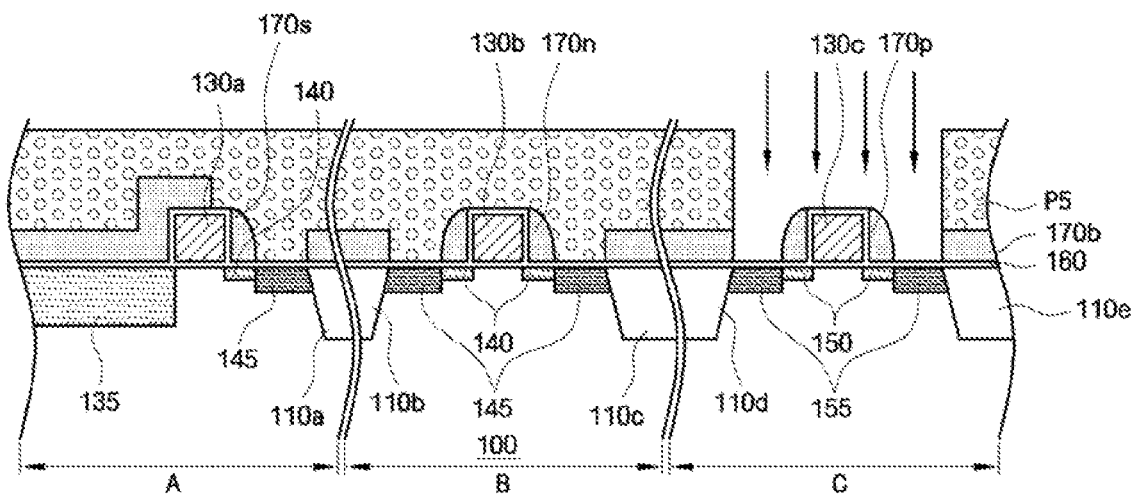

Referring to FIG. 8, a fifth photoresist pattern P5 is formed to form a P+ impurity injection region 155, silicon nitride film spacers 170p is formed on the sides of the gate electrode 130c formed on the PMOS region C by etching the first silicon nitride film pattern 170a, and the impurity injection region 155 is formed by injecting the P type impurities. The P+ impurity injection region 155 may be formed by, for example, injecting B ion to achieve a 3.0 E15/cm$^2$ dose. The first silicon nitride film pattern 170a transforms to the second silicon nitride film pattern 170b on which the silicon nitride film spacer 170p is formed on the PMOS region C.

The fifth photoresist pattern P5 is removed.

Figure 9:
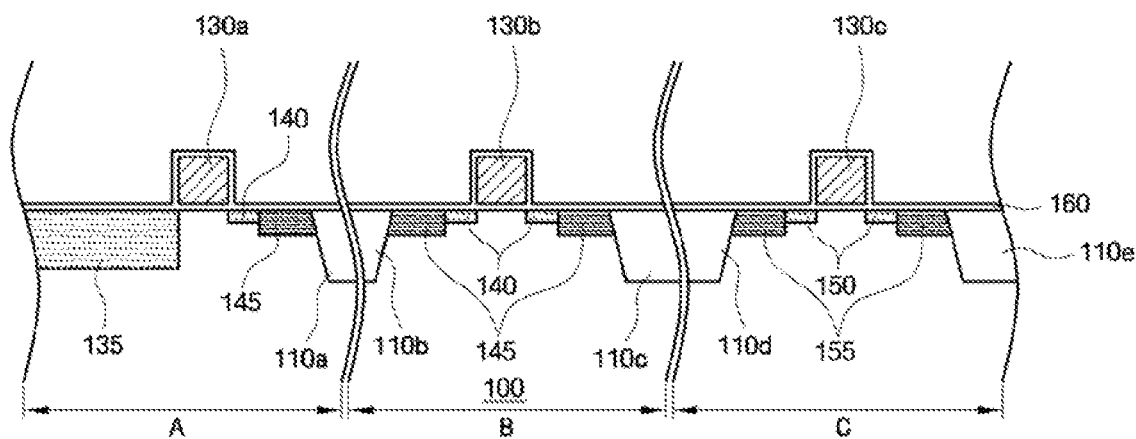

Referring to FIG. 9, the second silicon nitride film pattern 170b is removed. The second silicon nitride film pattern 170b can be removed using, for example, ortho-phosphoric acid (H$_3$PO$_4$). Similar to a dry etching method, that is, a case of forming the silicon nitride film spacers 170s, 170n, and 170p, the second silicon nitride film pattern 170b can be removed by exciting a gas including the halogen elements to a plasma state. When the second silicon nitride film pattern 170b is removed by a wet etching method, less damage occurs on the surfaces of the substrate 100, specifically, the surfaces of the impurity injection regions 140, 145, 150, and 155 than the case of using the dry etching method.

Figure 10:
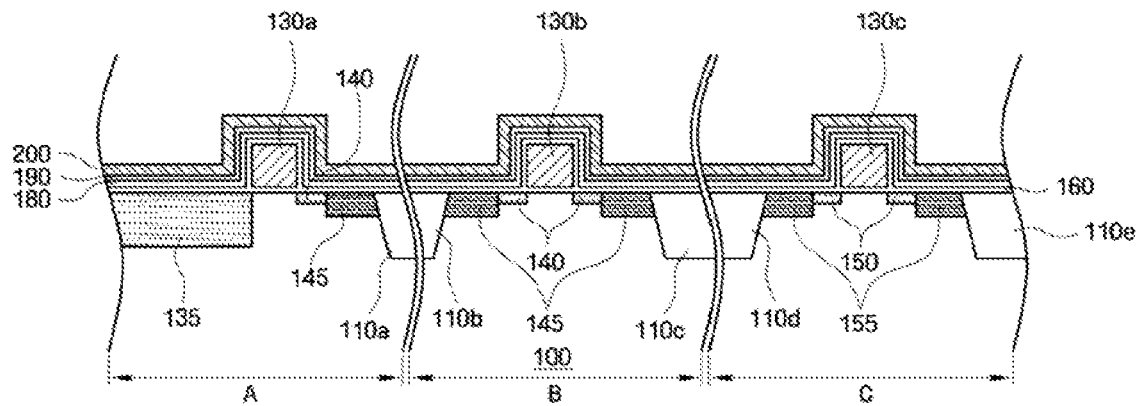

Referring to FIG. 10, a third silicon oxide film 180, a second silicon nitride film 190, and a first silicon oxynitride film 200 are formed. The third silicon oxide film 180 can be formed, for example, at the temperature of 500 to 600° Celsius. The third silicon oxide film 180 may be formed by a deposition method or an oxidation method. Further, the second silicon nitride film 190 and first silicon oxynitride film 200 may be formed by the deposition method. The thickness of each film does not need to be specifically limited. For example, the thickness of the third silicon oxide film 180 is less than about 100 Å, the thickness of the second silicon nitride film 190 is less than about 250 Å, and the thickness of the first silicon oxynitride film 200 may be formed to be less than about 500 Å.

Even though it is not described in detail in FIG. 10, the thickness of the third silicon oxide film 180, the second silicon nitride film 190, and first silicon oxynitride film 200 formed in the horizontal direction, that is, on the photodiode region 135, the substrate 100, and the gate electrodes 130a, 130b, and 130c may be formed to be greater than the widths of the third silicon oxide film 180, the second silicon nitride film 190, and first silicon oxynitride film 200 formed on the sides of the gate electrodes 130a, 130b, and 130c.

Figure 11:
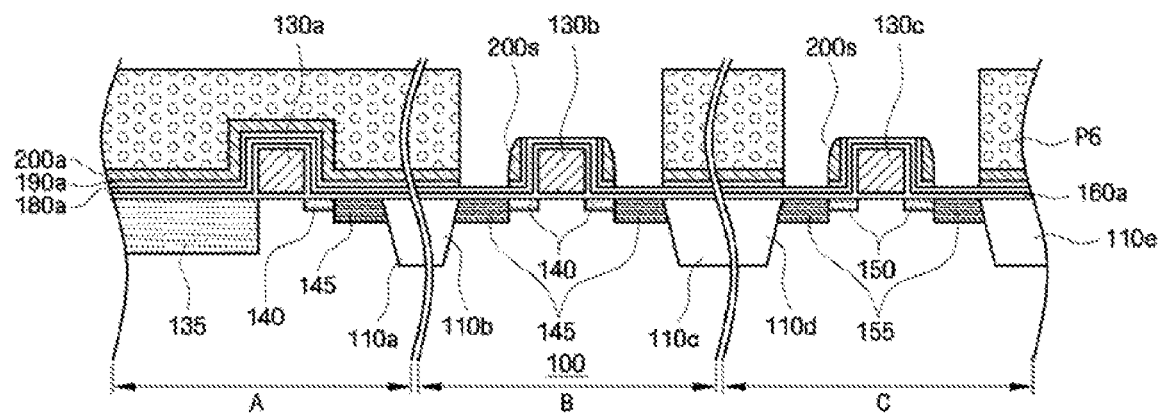

Referring to FIG. 11, a sixth photoresist pattern P6 is formed to expose regions on which silicide will be formed. A first silicon oxynitride film pattern 200a and the third silicon nitride film pattern 190a are formed by etching the first silicon oxynitride film 200 and the second silicon nitride film 190. On the surface of the impurity injection regions 140, 145, 150, and 155 or on the upper surface of the gate electrodes 130b and 130c, the photolithography process and the etching process may be performed to expose regions where the silicide will be formed. Each of the impurity injection regions 140, 145, 150, and 155 may serve as sources or drains of the gate electrodes 130a, 130b, and 130c. The silicide regions may be partly formed on the sources or drains of the NMOS region B and the PMOS region C or on the upper portions of the gate electrodes 130b and 130c. The silicide region is partly formed on the sources or drains of the NMOS and PMOS regions or on the upper portions of the gate electrodes 130b and 130c.

The first silicon oxynitride film 200 and the second silicon nitride film 190 are etched while patterning to form the spacer 200s on the sides of the gate electrodes 130b and 130c. When the spacer 200s is formed, the second silicon nitride film 190 and the first silicon oxynitride film 200 transform to the second silicon nitride film pattern 190a and the first silicon oxynitride film pattern 200a.

The sixth photoresist, pattern P6 is removed.

Figure 12:
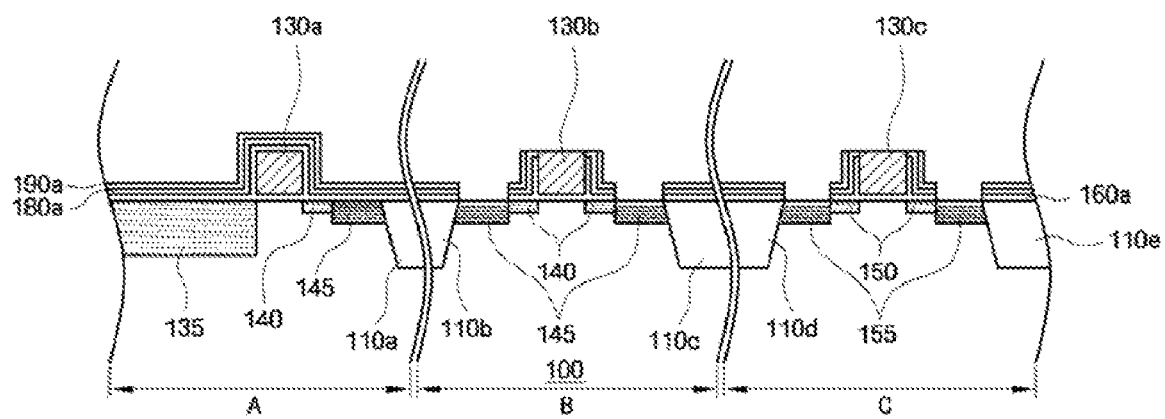

Referring to FIG. 12, the second and third oxide film patterns 160a and 180a are formed by removing the first silicon oxynitride film pattern 200a, the third silicon oxide film 180 and the second silicon oxide film 160 exposed after removing the first silicon oxynitride film pattern 200a. The first silicon oxynitride film pattern 200a can be removed by a wet etching method using etchant including fluoric acid, phosphoric, acid, aqueous hydrogen peroxide, and water. The third silicon oxide film pattern 180a can be removed by a wet etching method using etchant including fluoric acid. When the second and third silicon oxide film patterns 160a and 180a are formed, regions on which the silicide will be formed are exposed. For example, the upper portions of the gate electrodes 130b and 130c and the source and drain regions 140, 145, 150, and 155 formed on the surface of the substrate 100 in the NMOS region B and the PMOS region C are selectively exposed. Here, on the upper portions of the gate electrodes 130b and 130c, only regions on which a contact or via plug will be formed are exposed.

Figure 13:
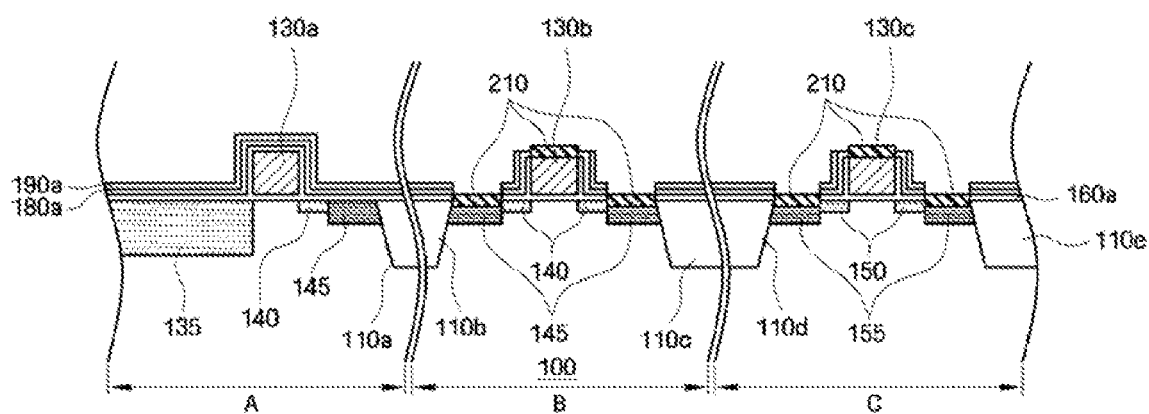

Referring to FIG. 13, silicide layers 210 are formed on the exposed upper portion of the gate electrodes 130b and 130c and on the source and drain regions 140, 145, 150, and 155. The silicide layers 210 may be fanned through the reaction of a metal and silicon when the metal is deposited and heated. In order to form the silicide layers 210, the metal is physically deposited to have a thickness of hundreds of Å, for example, a thickness of about 200 Å and then heated by hundreds of degrees, for example, 300 to 600° Celsius. The silicide layers 210 may be formed of a metal having one of tungsten (W), cobalt (Co), nickel (Ni), and titanium (Ti). Further, the silicide layers 210 may be formed by forming the metal layers and the titanium nitride layer (TiN) on regions on which the silicide layers 210 will he formed and heating the formed metal layers and the titanium nitride layer. When forming the titanium nitride layer (TiN), the silicide layers 210 may have low resistance through the reaction with a natural oxide film formed on the upper portions of the exposed gate electrodes 130b and 130c and the source and drain regions 140, 145, 150, and 155. After forming the silicide layers 210, metal layers on which the silicide layers are not formed are removed. The metal layers can be removed using both of the dry etching method and the wet etching method. Since methods of removing the metal layer are well known, the detailed explanation is omitted.

On the other hand, the silicide layers 210 may be formed using an electroless plating method. When using the electroless plating method, the silicide layers 210 may be formed by dipping the metal in the electrolyte such that metal layers are formed on a portion where the silicide layers 120 should be formed without the metal deposition.

Figure 14:
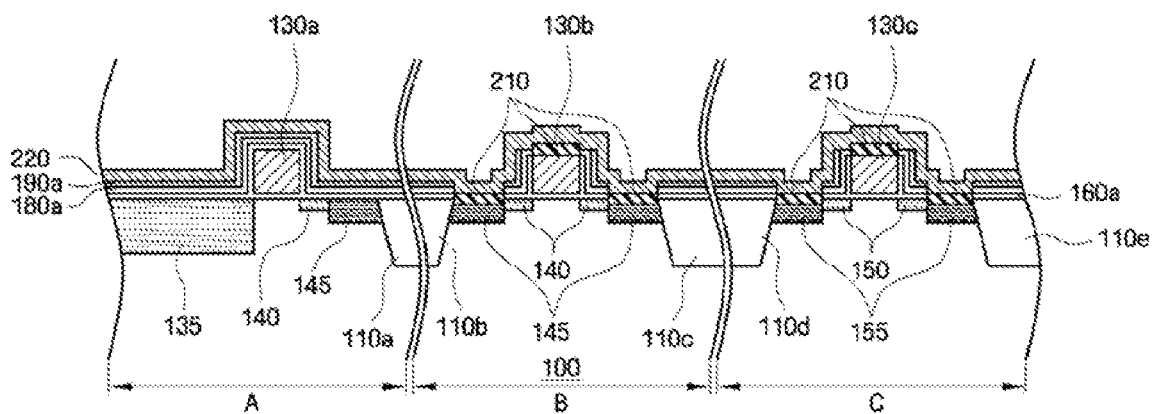

Referring to FIG. 14, when the silicide layers 210 are formed, the second silicon oxynitride layer 220 is formed. The second silicon oxynitride layer 220 may be formed in the thickness of hundreds Å. For example, second silicon oxynitride layer 220 may be formed in the thickness of about 350 Å. The second silicon oxynitride layer 220 can serve as a reflection preventing layer on the upper portion of the photodiode 135.

As shown in FIG. 1, the CMOS image sensor according to an embodiment of the present invention is manufactured by forming the interlayer insulating layer 230 to cover the substrate and forming the via plugs 240 connected to each of the impurity injection regions 140, 145, 150, and 155. Known processes can be used for the processes after forming the interlayer insulating layer 230.

When using a method of manufacturing the CMOS image sensor according to an embodiment of the present invention, the plasma damage due to the dry etching does not occur on the layer 160, 180, 190, and 220 formed on the photodiode 135.

Although exemplary embodiments of the present invention have been described with reference to the accompanying drawings, it will be apparent to those skilled in the art that various modifications and changes may be made thereto without departing from the scope and spirit of disclosure. Therefore, it should be understood that embodiments are not limiting, but illustrative in all aspects.

As described above, since the plasma damage does not occur on the layers formed on the photodiode in the CMOS image sensor manufactured using a method of manufacturing a CMOS image sensor according to an embodiment of the present invention, the films are not damaged due to plasma. Therefore, it is possible to substantially prevent a dark current from being generated.

What is claimed is:

1. A method of manufacturing a CMOS image sensor, the method comprising:
    forming isolation regions in a substrate;
    forming a first insulating layer on an entire surface of the substrate;
    forming gate electrodes on the first insulating layer;
    forming a photodiode region in the substrate;
    forming first impurity injection regions, each serving as one of a source and a drain of the gate electrodes;
    forming a second insulating layer covering the first insulating layer and the gate electrodes;
forming patterns of the second insulating layer exposing the first insulating layer formed on the first impurity injection regions and forming first spacers on sides of the gate electrodes;
    forming second impurity injection regions, each serving as one of a source and a drain of the gate electrodes;
    removing the patterns of the second insulating layer;
    forming a third insulating layer covering a result of removing the patterns of the second insulating layer;
    forming a fourth insulating layer to cover the third insulating layer;
    forming a fifth insulating layer to cover the fourth insulating layer;
    etching the fourth and fifth insulating layers exposing the third insulating layer formed on upper portions of the gate electrodes and on surfaces of the second impurity injection regions, and forming patterns of the fourth and fifth insulating layer forming second spacers on the sides of the gate electrodes;
    removing the fifth insulating layer pattern;
    removing an exposed third insulating layer exposing the first insulating layer formed on the upper portions of the gate electrodes and the surfaces of the second impurity injection regions;
    removing an exposed first insulating layer exposing the upper surfaces of the gate electrodes and the surfaces of the second impurity injection regions;
    forming metal layers on the upper surfaces of the gate electrodes and the surfaces of the second impurity injection regions;
    forming silicide layers by heating the metal layers;
    forming a sixth insulating layer covering a result of forming the silicide layers;
    forming an interlayer insulating layer covering the sixth insulating layer; and
    forming via plugs vertically passing through the interlayer insulating layer and connected to the silicide layers.

2. The method of claim 1, further comprising forming a intermediate insulating layer between the first insulating layer and the gate electrodes.

3. The method of claim 2, wherein the intermediate insulating layer is formed of silicon oxide.

4. The method of claim 1, wherein the first and third insulating layers are silicon oxide films.

5. The method of claim 1, wherein the first insulating layer is a gate insulating film insulating the substrate from the gate electrodes.

6. The method of claim 1, wherein the gate electrodes are formed of polycrystalline silicon.

7. The method of claim 1, wherein the photodiode region comprises N type impurity injection regions and P type impurity injection regions formed in the substrate, the N type impurity injection regions formed deeper in the substrate than the P type impurity injection regions.

8. The method of claim 1, wherein the second and fourth insulating layers are silicon nitride films.

9. The method of claim 1, wherein the forming of the first impurity injection regions comprises:
   forming first N type impurity injection regions; and
   forming first P type impurity injection regions.

10. The method of claim 1, wherein the forming of the second impurity injection regions comprises:
    forming second N type impurity injection regions; and
    forming second P type impurity injection regions, and
    the second impurity injection regions are more heavily doped than the first impurity injection regions.

11. The method of claim 1, wherein the fifth and sixth insulating layers are silicon oxynitride films.

12. The method of claim 1, wherein silicide is one of WSi, CoSi, TiSi, and NiSi.

* * * * *